United States Patent
Numaguchi

(12) 
(10) Patent No.: US 6,275,784 B1
(45) Date of Patent: Aug. 14, 2001

(54) DESIGN METHOD OF ROUTING SIGNAL LINES BETWEEN CIRCUIT BLOCKS FOR EQUALIZING CHARACTERISTICS OF CIRCUIT BLOCKS AND SEMICONDUCTOR INTEGRATED CIRCUIT DEVICE DESIGNED THERETHROUGH

(75) Inventor: Yoshitomo Numaguchi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/234,469

(22) Filed: Jan. 21, 1999

(30) Foreign Application Priority Data

Jan. 26, 1998 (JP) .................................................. 10-012335

(51) Int. Cl.⁷ ..................................................... G06F 17/50
(52) U.S. Cl. .............................. 703/1; 703/19; 716/13-14
(58) Field of Search ........................... 703/1, 19; 716/13, 716/17

(56) References Cited

U.S. PATENT DOCUMENTS

| 5,300,798 | * | 4/1994 | Yamazaki et al. | 257/207 |
| 5,657,243 | * | 8/1997 | Toyonaga et al. | 364/491 |
| 5,745,533 | * | 4/1998 | Asada et al. | 375/354 |

FOREIGN PATENT DOCUMENTS

5-343523  12/1993  (JP) .

* cited by examiner

Primary Examiner—Kevin J. Teska
Assistant Examiner—Thai Phan
(74) Attorney, Agent, or Firm—McGinn & Gibb, PLLC

(57) ABSTRACT

An integrated circuit device is layoutted on a semiconductor chip, and signal lines are routed between circuit blocks to be integrated on the semiconductor chip, wherein a conductive line is branched from another conductive line passing over one of certain circuit blocks expected to be identical in circuit characteristics with one another in order to pass over the other of the certain circuit blocks, thereby equalizing electric influence of a signal passing through the conductive line on the certain circuit blocks.

27 Claims, 9 Drawing Sheets

DESIGN METHOD OF ROUTING SIGNAL LINES BETWEEN CIRCUIT BLOCKS FOR EQUALIZING CHARACTERISTICS OF CIRCUIT BLOCKS AND SEMICONDUCTOR INTEGRATED CIRCUIT DEVICE DESIGNED THERETHROUGH

FIELD OF THE INVENTION

This invention relates to a design method for a semiconductor integrated circuit device and, more particularly, to a design method for routing signal lines between circuit blocks on a semiconductor chip and a semiconductor integrated circuit device designed therethrough.

DESCRIPTION OF THE RELATED ART

Various circuit blocks are incorporated in a semiconductor integrated circuit device, and the function of some circuit blocks is identical. The circuit blocks with an identical function are hereinbelow referred to as "identical blocks". It is important for the manufacturer to eliminate differences in electric characteristics such as timing from the identical blocks, because a time lag results in a malfunction of the semiconductor integrated circuit device. A capacitive coupling between the parallel signal lines and a capacitive coupling between the crossing signal lines strongly affect the signal propagation speed designed under sever design rules. Especially, the circuit blocks affect signals on the signal lines adjacent thereto.

A design method for eliminating the undesirable influence from the circuit blocks is disclosed in Japanese Patent Publication of Unexamined Application No. 5-343523. The prior art design method partially or completely prohibits a designer from passing signal lines through a zone over identical blocks. FIG. 1 illustrates the prior art design method.

The prior art design work starts with extraction of identical blocks from pieces of design information representative of circuit blocks to be integrated on a semiconductor chip and interconnections therebetween as by step SPI. A piece of design information is representative of prohibition rules where a designer is not allowed to pass signal lines, and is added to the identical blocks. Then, the circuit designer is prohibited from passing signal lines over the identical blocks as by step SP2.

Subsequently, the circuit blocks are arranged on the semiconductor chip as by step SP3. The area occupied by each circuit block and the interconnections are taken into account for the arrangement of the circuit blocks. A circuit block is selected from those circuit blocks on the semiconductor chip, and is connected to another circuit block through a signal line or lines as by step SP4. After step SP4, the pieces of design information are checked to see whether or not all the signal lines have been connected between circuit blocks as by step SP5.

If the answer at step SP5 is given negative, the control returns to step SP4, and reiterates the loop consisting of steps SP4 and SP5 until change from negative to affirmative. While the control is reiterating the loop, pairs of nodes a1/a2, b1/b2, c1/c2, d1/d2 and e1/e2 to be connected are on both sides of the identical blocks 1/2 as shown in FIG. 2. The identical blocks 1 and 2 are arranged in symmetry with respect to a routing lattice 3 as indicated by capital letter "F". However, signal lines are prohibited from passing through the zones over the identical blocks 1/2. The prohibited zones are indicated by hatching lines. For this reason, the designer has to route signal lines 4a/4b/4c/4d/4e outside the peripheries of the identical blocks 1/2, and the signal lines 4a/4b/4c/4d bypass the prohibited zones. When all the signal lines are connected between the circuit blocks, the answer at step SP5 is given affirmative, and the design work is completed.

Another prior art design method renders signal lines to pass an area between pairs of identical circuits arranged in symmetry. FIG. 3 illustrates the layout of an integrated circuit fabricated on a semiconductor chip. Reference numerals 5a/5b, 6a/6b and 7a/7b designate pairs of identical blocks. The identical blocks 5a/6a/7a are arranged in symmetry with the identical blocks 5b/6b/7b as indicated by capital letter "F". The area between the identical blocks 5a/6a/7a and 5b/6b/7b is assigned to a virtual lattice available for signal lines, and the line of symmetry extends through the area. If nodes a1/a2 are to be connected, a signal line 8 extends through the area between the identical blocks 5a/6a/7a and the identical blocks 5b/6b/7b.

However, the semiconductor integrated circuit devices have become complicated, the designers encounter the following problems in the prior art design methods. When the manufacturer designs the complicated integrated circuit device through the first prior art design method, the first design method requires a large semiconductor chip. In detail, a large number of identical blocks are incorporated in the complicated integrated circuit device, and the first prior art design method prohibits the designer from using the zone over each identical block. The identical blocks occupy wide area, and the prohibited zone is so much. The signal lines have to bypass the prohibited zone, and require additional area around the identical blocks. The additional area enlarges the semiconductor chip. Assuming now that one of ten signal lines has nodes to be connected over an identical block equivalent to 200 lines of the routing lattice, the designer has to route 20 signal lines around the identical block, and the 20 signal lines requires the additional area at least 10 percent of the area occupied by the identical block.

On the other hand, the manufacturer encounters a problem in the second prior art design method in many limitations on the routing work. In detail, the second prior art design method requires a line of symmetry passing between identical blocks paired with each other. If the line of symmetry is not found, the designer can not route a signal line beside an identical block. For example, if the identical block 5a is located in an area on the right side of the identical block 5b, the pair of identical blocks 5b/5a interrupts the line of symmetry, and the designer can not connect the nodes a1/a2 through the signal line 8. If the designer connects the nodes a1/a2 through the signal line 8, the signal line affects the identical block 5b only, and the identical blocks 5a/5b can not equivalently behave in the integrated circuit device. For this reason, the designer needs to rearrange the circuit blocks on the semiconductor chip.

SUMMARY OF THE INVENTION

It is therefore an important object of the present invention to provide a design method for routing signal lines which allows a designer to connect nodes on both sides of identical blocks without additional area and a line of symmetry.

It is also an important object of the present invention to provide a semiconductor integrated circuit device, which has identical blocks identical in circuit characteristics with one another.

To accomplish the object, the present invention proposes to branch a conductive line from another conductive line so that the branched signal lines extend over all the certain circuit blocks.

In accordance with one aspect of the present invention, there is provided a design method for routing conductive lines between nodes to be electrically connected comprising the steps of selecting certain circuit blocks expected to be identical in circuit characteristics with one another from circuit blocks to be integrated on a substrate, arranging the circuit blocks in an area of the substrate and routing conductive lines between the circuit blocks, wherein, if one of the conductive lines passes over one of the certain circuit blocks, at least one conductive sub-line is branched from the aforesaid one of the conductive lines in order to pass another of the certain circuit blocks.

In accordance with another aspect of the present invention, there is provided a semiconductor integrated circuit device fabricated on a semiconductor chip comprising a plurality of circuit blocks having certain circuit blocks to be identical in circuit characteristics with one another and a plurality of conductive lines selectively connected between the plurality of circuit blocks, and having at least one of the plurality of conductive lines passing over one of the certain circuit blocks, and a conductive sub-line is branched from the at least one of the plurality of conductive lines in order to pass over another of the certain circuit blocks.

BRIEF DESCRIPTION OF THE DRAWINGS

The features and advantages of the design method will be more clearly understood from the following description taken in conjunction with the accompanying drawings in which.

DESCRIPTION OF THE PREFERRED EMBODIMENTS

First Embodiment

Figure 1:
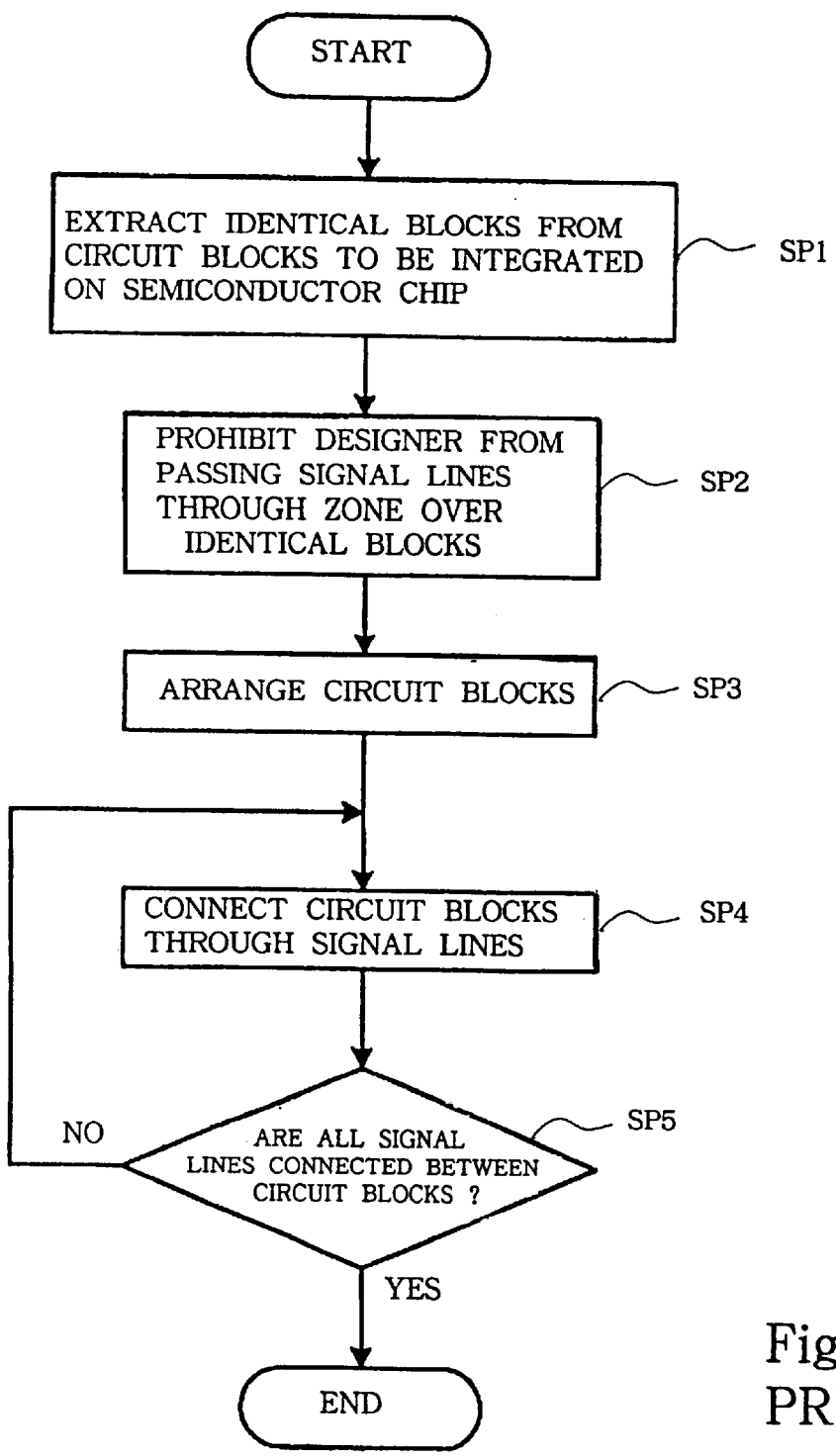
FIG. 1 is a flow chart showing the prior art design method disclosed in Japanese Patent Publication of Unexamined Application No. 5-343523.
Figure 2:
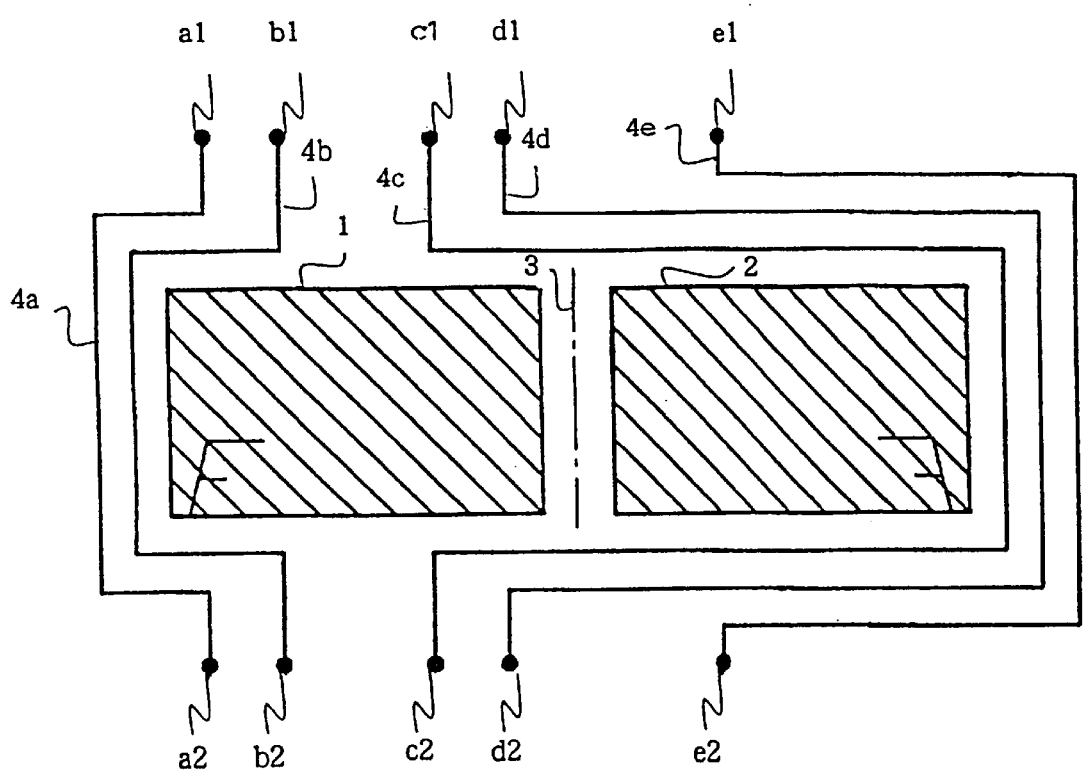
FIG. 2 is a plane view showing the layout of the semiconductor integrated circuit device by using the prior art design method disclosed in Japanese Patent Publication of Unexamined Application No. 5-343523.
Figure 3:
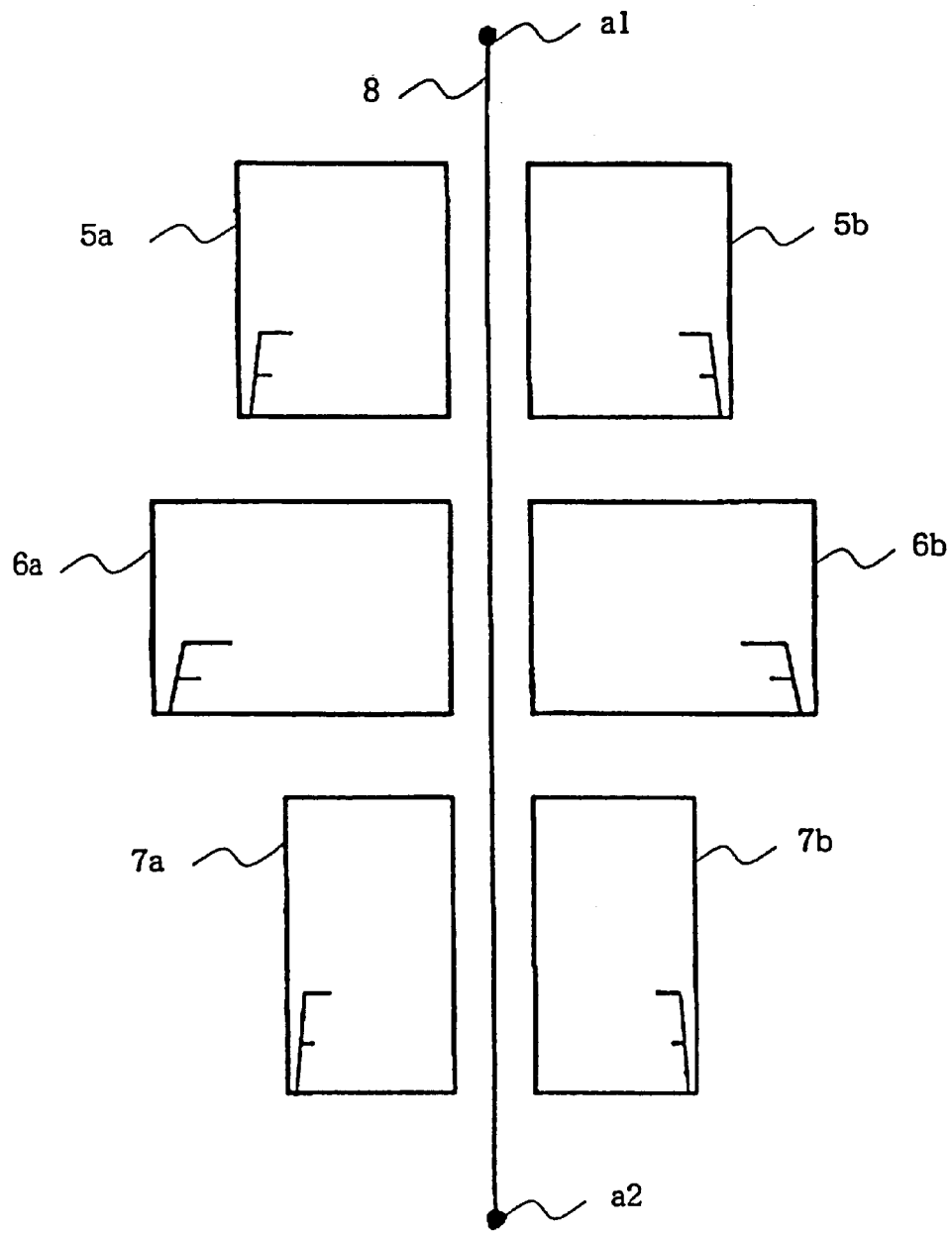
FIG. 3 is a plane view showing the layout of the semiconductor integrated circuit device by using another prior art design method.
Figure 4:
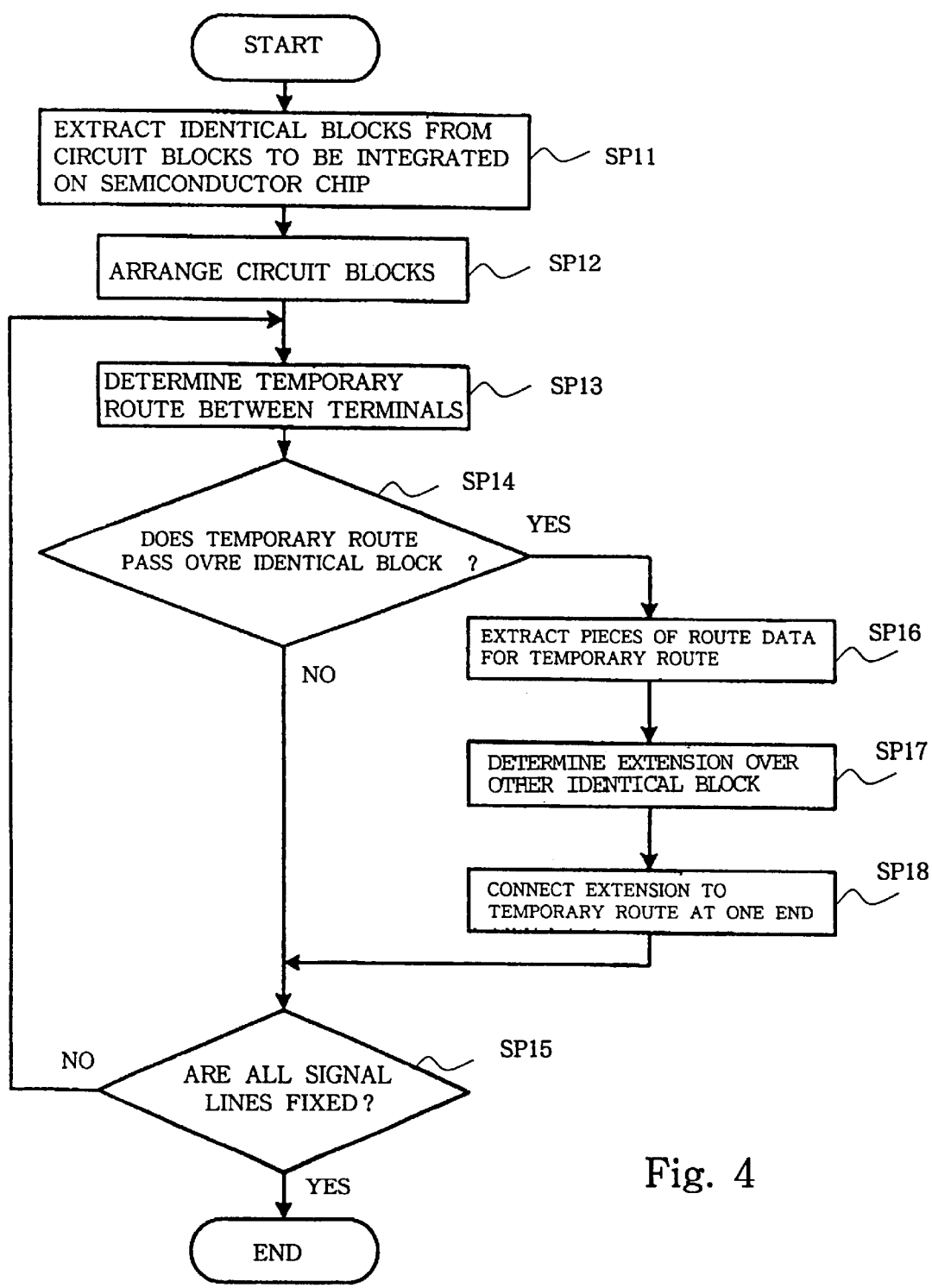
FIG. 4 is a flow chart showing essential steps of a design method according to the present invention.
Figure 5:
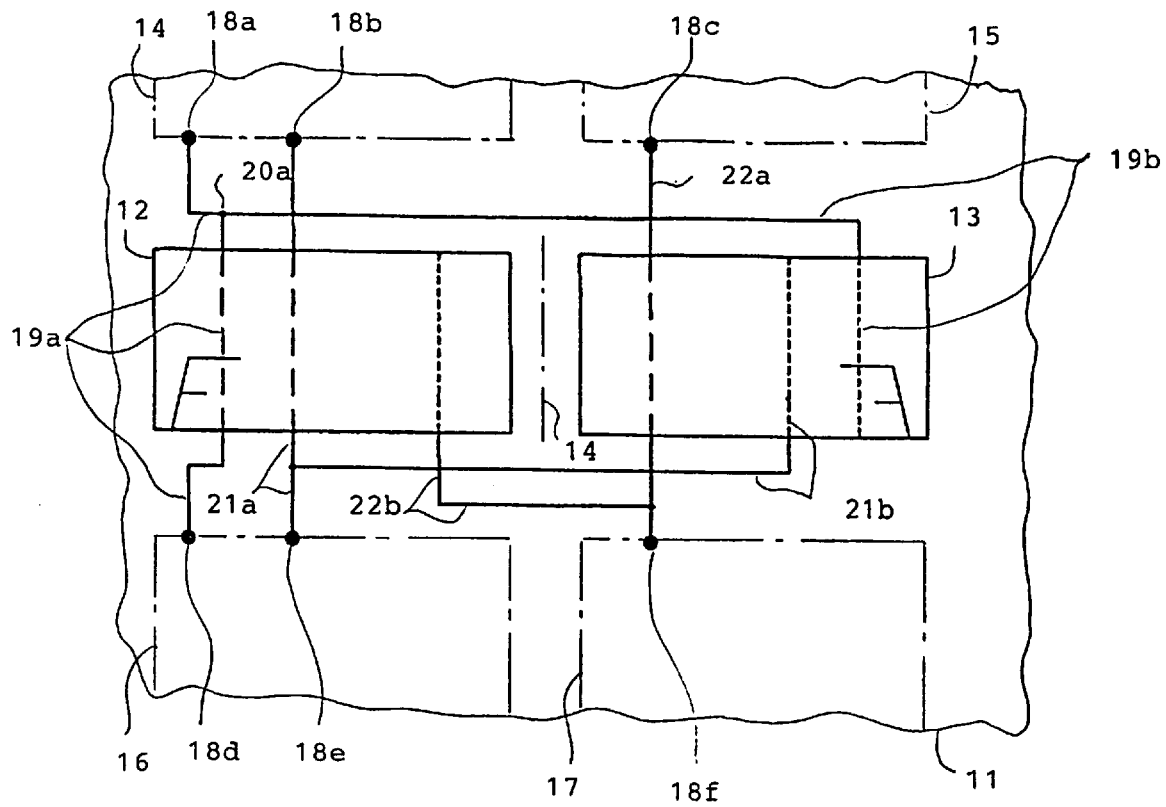
FIG. 5 is a plane view showing identical blocks of a semiconductor integrated circuit device designed through the method according to the present invention.

FIG. 4 illustrates essential steps of a design method embodying the present invention, and FIG. 5 shows a part of the layout of a semiconductor integrated circuit. A manufacturer is assumed to assign a design job to a designer for the semiconductor integrated circuit. The semiconductor integrated circuit device is fabricated on a semiconductor chip 11, and a large number of circuit blocks 12/13/14/15/16/17 . . . called as "macro-cells" are to be incorporated in the semiconductor integrated circuit. The circuit blocks 12/13/14/15/16/17/ . . . have terminal to be connected. Several terminals are shown in FIG. 5, and are labeled with 18a/18b/18c/18d/18e/18f, respectively. The designer uses a design tool for an autoplacement and an autorouting.

The design method starts preparation of pieces of design data representative of circuit blocks 12/13/14/15/16/17 to be integrated on the semiconductor chip 11 and interconnections between the circuit blocks, and the pieces of design data are stored in a data base. The designer instructs the design tool to extract identical blocks 12/13 from the circuit blocks 12–17 as by step SP11. The identical blocks 12/13 are expected to be identical in circuit characteristics in the semiconductor integrated circuit. An example of the identical circuit is a dynamic circuit. A capacitor is incorporated in the dynamic circuit for accumulating electric charge, and the electric charge forms an electric signal to be supplied to another circuit block. If a parasitic capacitor is undesirably coupled to the capacitor of the dynamic circuit, the parasitic capacitor affects the accumulation of electric charge and, accordingly, generation of the electric signal. For this reason, when plural dynamic circuits are arranged in parallel, the designer has to equalize the electric influence of the parasitic capacitor on the plural dynamic circuits.

Subsequently, the designer instructs the design tool to arrange the circuit blocks 12–17 on an area corresponding to the real estate of the semiconductor chip 11 as by step SP12. The design tool takes the pieces of design data representative of the circuit configuration of each circuit block 12–17 and conditions for the interconnection into account, and arranges the circuit blocks 12–17 in the area. Plural identical blocks 12/13 are arranged in symmetry with respect to a virtual line of symmetry 14 as indicated by capital letter "F" and its mirror writing.

Upon completion of the autoplacing, the design tool proceeds to step SP13, and starts an autorouting. Though not shown in FIG. 5, virtual paths two-dimensionally extend over the area like a lattice, and are used in the autorouting. The design tool picks up a terminal to be connected to another terminal, and determines a temporary route between the terminals by selecting virtual paths from the lattice. The temporary route is represented by pieces of route data. The design tool checks the pieces of route data to see whether the temporary route passes over any one of the identical blocks 12/13 as by step SP14. If the answer at step SPI4 is given negative, the design tool fixes a signal line between the terminals to the temporary route, and stores the pieces of route data in an internal data storage. Then, the design tool proceeds to step SP15, and checks the internal data storage to see whether or not all the signal lines are fixed.

On the other hand, when the design tool is, by way of example, working for the terminals 18a and 18d, the temporary route 19a passes over the identical block 12, and the answer at step SP14 is given affirmative. Then, the design tool proceeds to step SP16.

The design tool extracts pieces of route data representative of a relative position of the temporary route with respect to the identical block 12, the direction of the virtual paths forming parts of the temporary route and the wiring level of the virtual paths for the temporary route 19a at step SP16. Thereafter, the design tool determines an extension 19b passing over the other identical block 13, and unused virtual paths of the lattice are used for the extension 19b as by step SP17. The extension 19b has a relative position with respect to the identical block 13, the direction of the virtual paths and the wiring level of the virtual paths respectively equivalent to those of the temporary route 19a.

Subsequently, the design tool connects the extension 19b to the temporary route 19a as by step SP18, and fixes a signal line between the terminals 18a and 18d to the combination of the temporary route and the extension 19a/19b. Thus, the signal line is branched to a signal path 19a and the extension 19b at node 20a. The signal path 19a over the identical block 12 is identical in the relative position, the direction and the wiring level with the extension 19b over the identical block 13, and a signal passing through the signal line 19a/19b equally affect the identical blocks 12/13. The design tool proceeds to step SP15, and checks the internal data storage to see whether or not all the signal lines are fixed. While the answer at step SP15 is given negative, the design tool returns to step SP13, and reiterates the loop consisting of steps SP13/SP14/SP16/SP17/SP18/SP15 until the answer is changed to affirmative. While the design tool is reiterating the loop, signal lines between terminals 18b/18c and 18e/18f are fixed to the combination of a temporary route 21a and an extension 21b and the combination of a temporary route 22a and an extension 22b, respectively. The relative position, the direction of virtual paths and the wiring level of the virtual paths are identical between the temporary routes 21a/22a and the extensions 21b/22b, and signals on the signal lines equally affect the identical blocks 12/13.

When all the terminals are connected by signal lines, the answer at step SP15 is given affirmative, and the design tool terminates the autorouting. As will be understood from the foregoing description, the identical blocks 12/13 are equally affected by the signal lines between the terminals 18a/18b/18c and the terminals 18d/18e/18f, and are equalized in the circuit characteristics.

Second Embodiment

Figure 6:
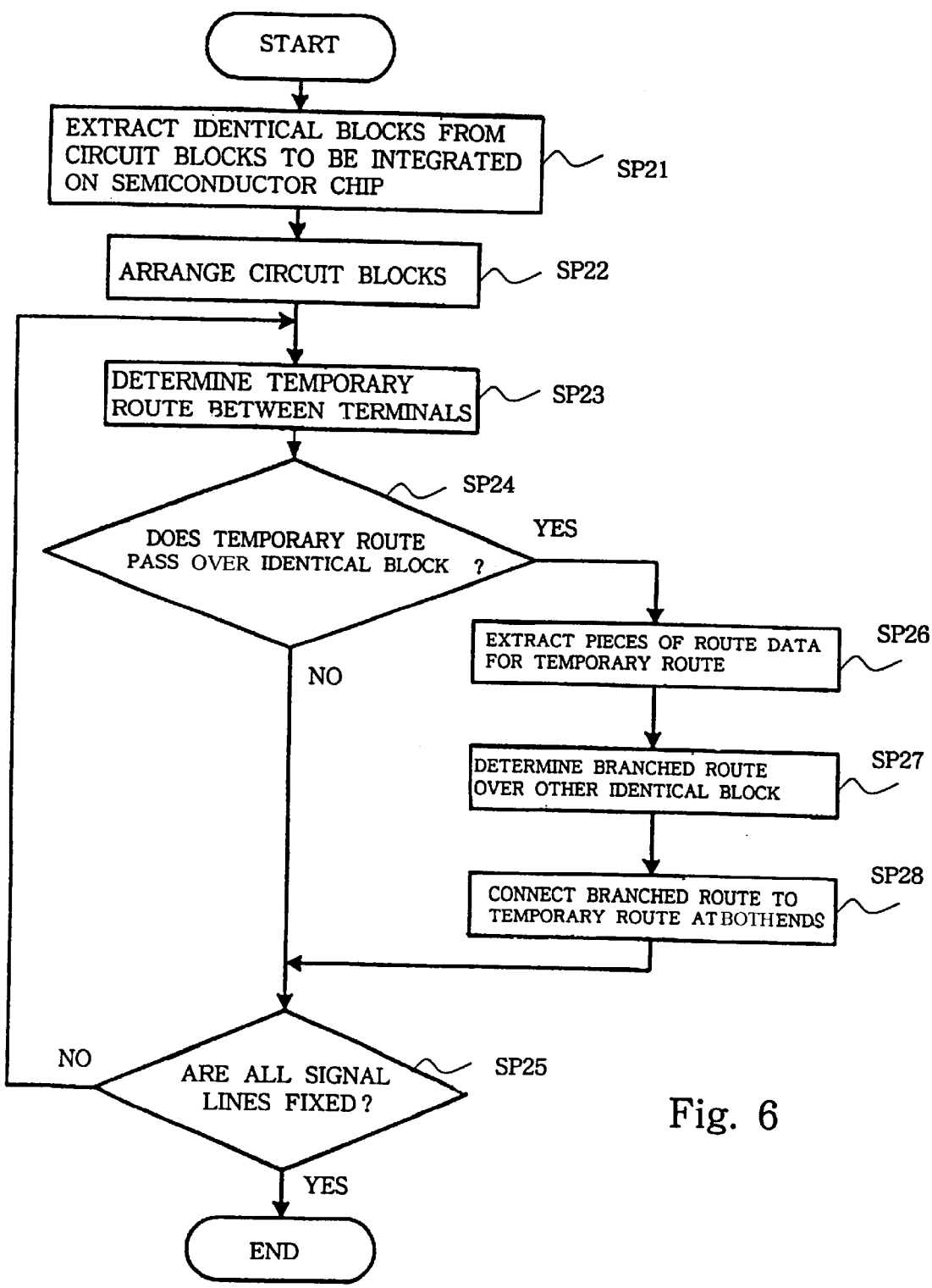
FIG. 6 is a flow chart showing essential steps of another design method according to the present invention.

FIG. 6 illustrates another design method embodying the present invention. The design method implementing the second embodiment essentially consists of steps SP21 to SP28. Steps SP21 to SP26 are similar to steps SP11 to SP16, respectively, and are not described hereinbelow for the sake of simplicity. Description is focused on steps SP27/SP28.

Figure 7:
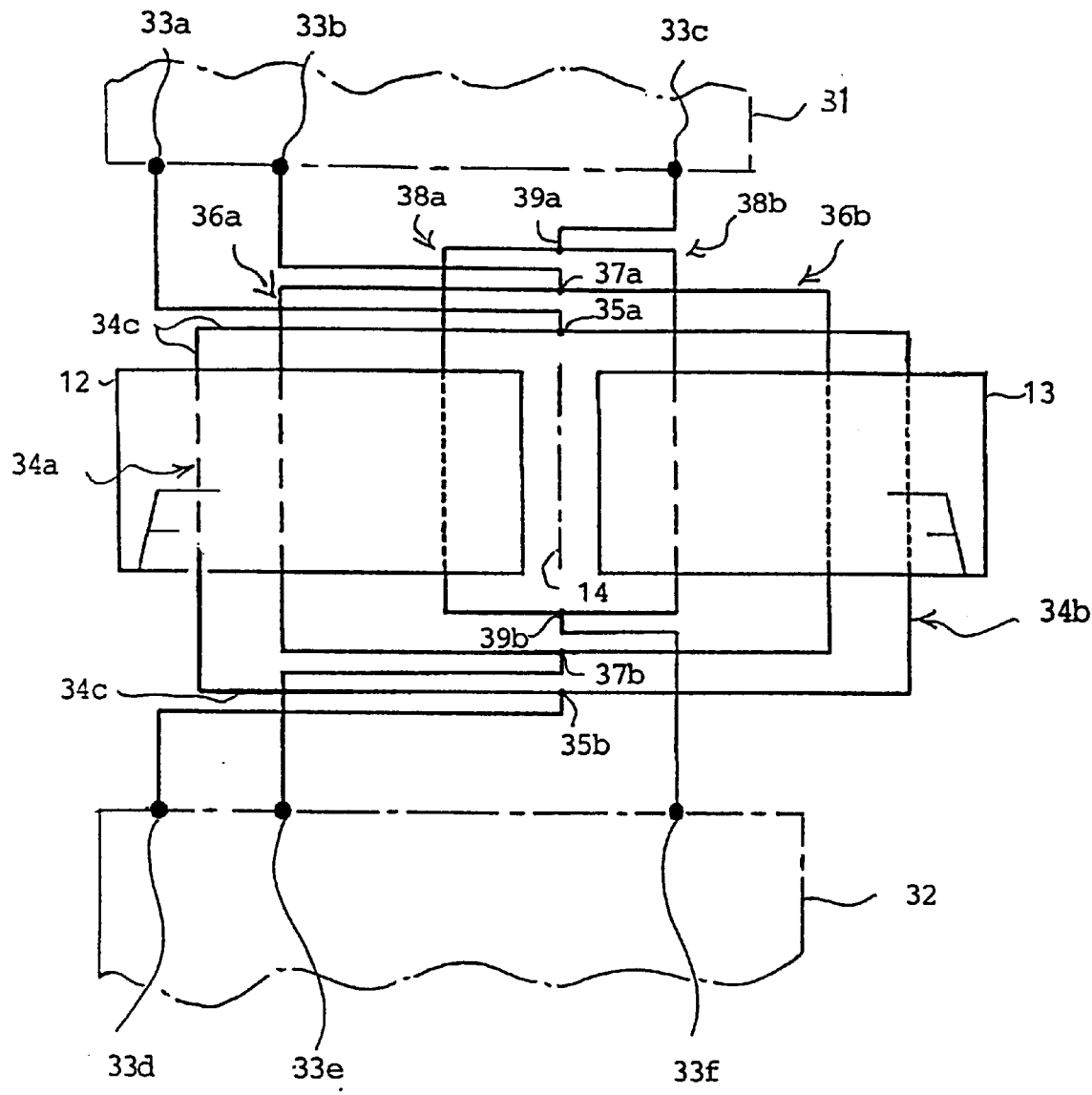
FIG. 7 is a plane view showing identical blocks of a semiconductor integrated circuit device designed through the method shown in FIG. 6.

FIG. 7 illustrates circuit blocks 12/13/31/32, and the identical blocks 12/13 are located between the circuit blocks 31/32. Terminals 33a/33b/33c are to be connected to terminals 33d/33e/33f, respectively. Assuming now that the design tool is routing a signal line between the terminals 33a and 33d, the answer at step SP24 is given affirmative, and the design tool extracts the pieces of route data representative of the relative position with respect to the identical block 12, the direction of virtual paths forming parts of a temporary route 34a in the lattice and the wiring level of the virtual paths as by step SP16.

Subsequently, the design tool determines a branched route 34b for the signal path between the terminals 33a and 33d as by step SP27. The branched route 34b has a relative position with respect to the identical block 13, a direction of virtual paths of the lattice and a wiring level of the virtual paths, which are equivalent to those of the temporary route 34a.

Subsequently, the design tool connects the temporary route 34a to the branched route 34b at both ends 35a/35b of the branched route 34b as by step SP28, and fixes the signal line between the terminals 33a and 33d to the combination of the temporary route and the branched route 34a/34b. In this instance, the total length of paths 34c between the ends 35a and 35b is equal to the total length of the branched route 35b.

The design tool routes other signal lines between the terminals 33b/33c and the terminals 33e/33f as similar to the signal line between the terminals 33a and 33d. The signal line between the terminals 33b and 33e is corresponding to the combination of a temporary route 36a and a branched route 36b, and the temporary route 36a and the branched route 36b are connected to each other at nodes 37a/37b. Similarly, the signal line between the terminals 33c and 33f is corresponding to the combination of a temporary route 38a and a branched route 38b, and the temporary route 38a and the branched route 38b are connected to each other at nodes 39a/39b.

The design method implementing the second embodiment achieves all the advantageous of the first embodiment. Moreover, a signal is propagated through the bifurcated portions of each signal line such as 34b/34c, and the resistance against the signal is decreased rather than that of the first embodiment. The bifurcated portions are equal in length, and the signal equally affects the identical blocks 12/13.

Third Embodiment

Figure 8:
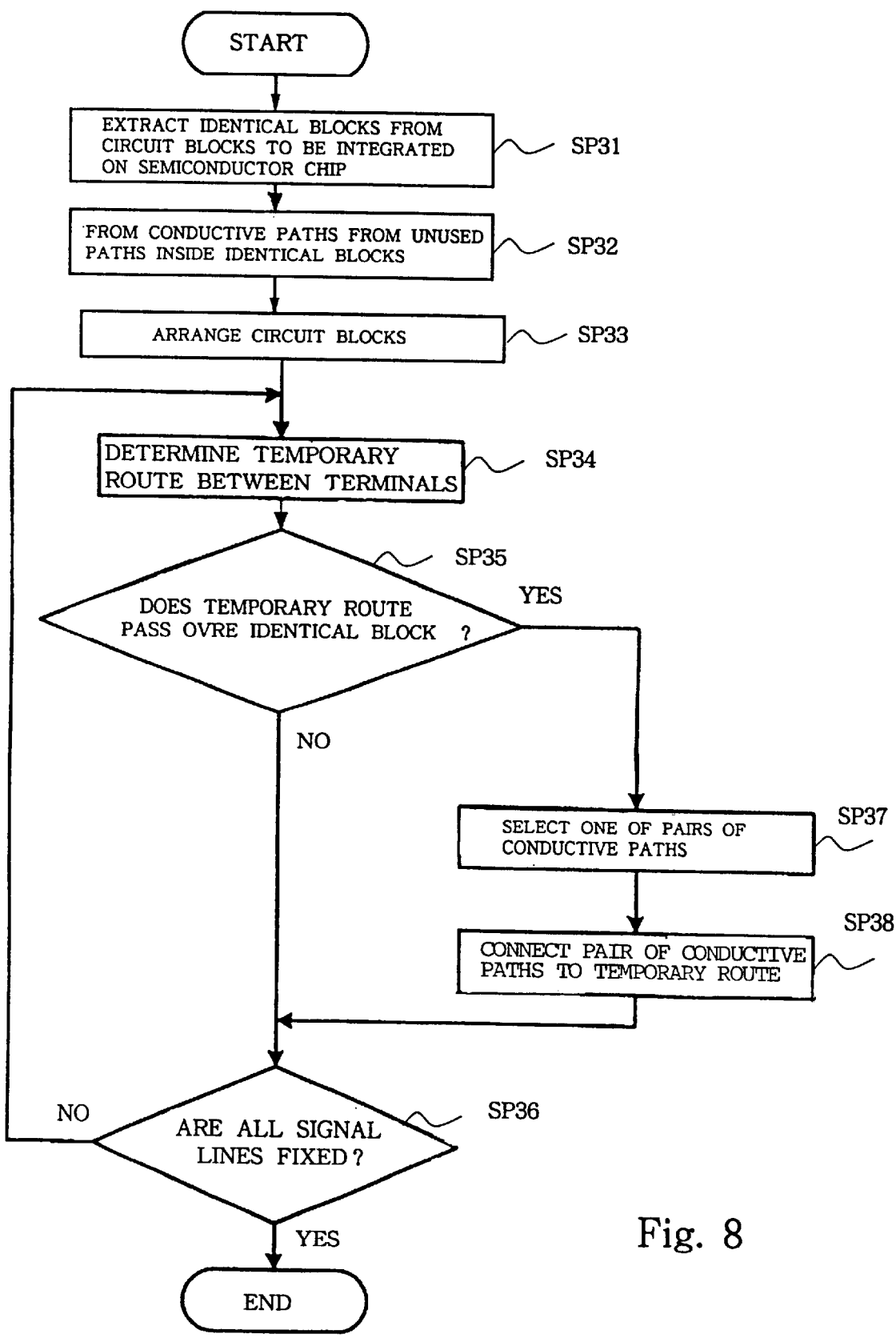
FIG. 8 is a flow chart showing essential steps of yet another design method according to the present invention.

FIG. 8 illustrates yet another design method embodying the present invention. The design method implementing the third embodiment is expected to route signal lines between terminals 41a/41b/41c and terminals 41d/41e/41f over identical blocks 42/43. A design tool is also used in an autoplacing and an autorouting.

The design method starts preparation of pieces of design data representative of circuit blocks 42/43/44/45/46/47 to be integrated on a semiconductor chip 48 and interconnections between the circuit blocks 42–47, and the pieces of design data are stored in a data base.

The designer instructs the design tool to specify the identical blocks 42/43 from the circuit blocks 42–47 as by step SP31. The design tool extracts the pieces of design data representative of the circuit configuration of the identical blocks 42/43 from the database, and specifies unused virtual paths of the lattice inside the peripheries of the identical blocks 42/43. The unused virtual paths form conductive paths 42a/42b/42c/42d/42e and 43a/43b/43c/43d/43e from the unused virtual paths as by step SP32, and the design tool secures the conductive parts 42a–42e and 43a–43e for an autorouting. The conductive paths 42a–42e have relative positions with respect to the identical block 42, and the conductive paths 43a–43e have relative positions with respect to the identical block 43 corresponding to the relative positions of the conductive paths 42a–42e. In other words, the conductive paths 42a–42e are paired with the conductive paths 43a–43e, respectively.

Subsequently, the design tool arranges the circuit blocks 12–17 on an area corresponding to the real estate of the semiconductor chip 48 as by step SP33 as similar to the first embodiment. The identical blocks 42/43 are arranged in symmetry with respect to a virtual line of symmetry 49 as indicated by capital letter "F" and its mirror writing.

Figure 9:
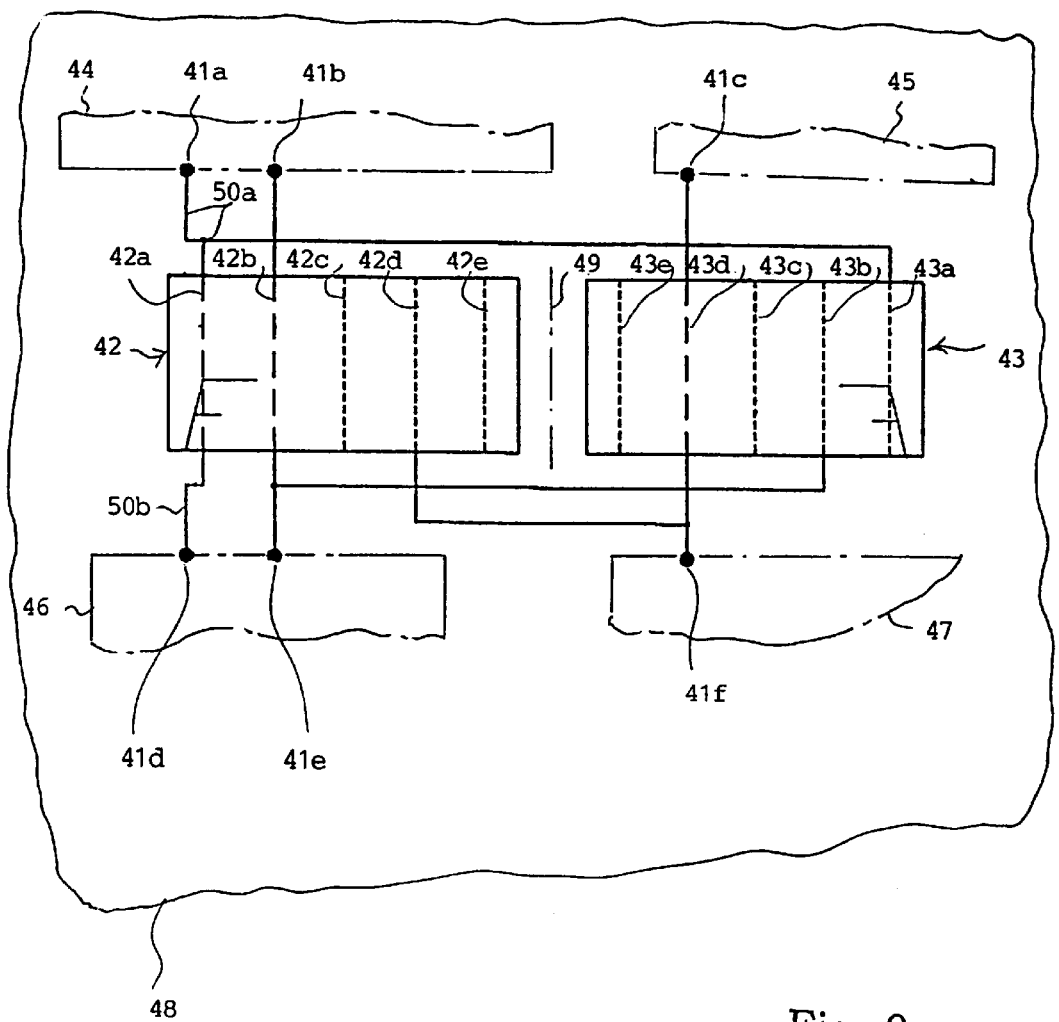
FIG. 9 is a plane view showing identical blocks of a semiconductor integrated circuit device designed through the method shown in FIG. 8.

Upon completion of the autoplacing, the design tool proceeds to step SP34, and starts an autorouting. Though not shown in FIG. 9, virtual paths two-dimensionally extend over the area like a lattice, and are used in the autorouting. The design tool picks up a terminal to be connected to another terminal, and determines a temporary route between the terminals by selecting virtual paths from the lattice. The temporary route is represented by pieces of route data. The design tool checks the pieces of route data to see whether the temporary route passes over any one of the identical blocks 42/43 as by step SP35. If the answer at step SP35 is given negative, the design tool fixes a signal line between the terminals to the temporary route, and stores the pieces of route data in an internal data storage. Then, the design tool proceeds to step SP36, and checks the internal data storage to see whether or not all the signal lines are fixed.

On the other hand, when the design tool is, by way of example, working for the terminals 41a and 41d, the identical block 42 spaces the terminals 41a and 41d, and the answer at step SP35 is given affirmative.

Subsequently, the design tool selects one of the pairs of conductive paths 42a/43a, and the pair of conductive paths 42a/43a is connected to parts 50a/50b of the temporary route as by step SP38. Thus, the design tool fixes the signal line between the terminals 41a and 41d to the combination of the temporary route 50a/50b and the pair of conductive paths 42a/43a. The design tool proceeds to step SP36.

The design tool checks the data base to see whether or not all the signal lines are fixed at step SP36. While the answer at step SP36 is given negative, the design tool reiterates the loop consisting of steps SP34/SP35/SP37/SP38/SP36, and fixes signal lines between the terminals. If terminals to be connected are spaced apart by one of the identical blocks 42/43, the design tool uses a pair of conductive paths 42b/43b, 42c/43c/42d/43d or 42e/43e, and fixes the signal line between the terminals to the combination of the temporary route and the pair of conductive paths. In this instance, the pair of conductive paths 42b/43b forms a part of the signal line between the terminals 41b/41e, and the pair of conductive paths 42d/43d forms a part of the signal line between the terminals 41c and 41f.

When all the signal lines are fixed, the answer at step SP36 is given affirmative, and the design tool terminates the autorouting.

The design method implementing the third embodiment achieves all the advantages of the first embodiment. Moreover, the job at step SP37 is simpler than the job at step SP16, because the pairs of conductive paths 42a/43a to 42e/43e have been already determined at step SP32.

As will be appreciated from the foregoing description, even if an identical block spaces a terminal from a terminal to be connected to the terminal, the signal line is branched in such a manner as to pass over the identical block and over another identical block to be equalized in circuit characteristics, and any additional area is required for the signal line. This results in a small semiconductor chip.

Moreover, the branched portions of the signal line are located at the same relative position between the identical blocks, and the signal on the signal line equally affects the circuit characteristics of the identical blocks. For this reason, the signals of the identical blocks concurrently arrive at respective destinations, and any time lag does not take place.

Finally, the symmetry is expected to the branched portions over the identical blocks to be equivalent. In other words, identical blocks to be equivalent to each other and other identical blocks to be equivalent to each other are not expected to share a line of symmetry. In this situation, the design tool is allowed to arrange pairs of identical blocks in a staggered manner. As a result, the design method according to the present invention enhances the flexibility of the autoplacing.

Although particular embodiments of the present invention have been shown and described, it will be apparent to those skilled in the art that various changes and modifications may be made without departing from the spirit and scope of the present invention.

If more than two identical blocks are expected to be equivalent in circuit characteristics to one another, more than one sub-line is branched from a signal line connected over one of the identical blocks, and passes over the others of the identical blocks. The signal line and the signal sub-lines are located at certain relative positions with respect to the associated identical blocks.

Each of the conductive paths 42a/42b/42d may be connected to the conductive path 43a/43b/43d at both ends thereof.

If electric influence due to a difference between the relative positions is ignoreable, the design tool may introduce a difference between the relative positions.

In the second embodiment, the resistance may be equalized by changing difference in width and/or thickness between the signal path and the branched path.

Steps SP32 and SP33 may be exchanged to each other.

What is claimed is:

1. A design method for routing conductive lines between nodes to be electrically connected, comprising:

determining circuit blocks expected to be identical in circuit characteristics with one another from among all circuit blocks to be integrated on a substrate;

selectively arranging said identical circuit blocks in an area of said substrate into at least one group of identical circuit blocks; and selectively routing said conductive lines such that, if a first conductive line of said conductive lines passes over a first circuit block of a first group of said at least one group of identical circuit blocks, then at least one of a conductive sub-line is branched from said first conductive line so as to pass over any other identical circuit block in said first group of identical circuit blocks.

2. The design method as set forth in claim 1, wherein a part of said first conductive line located over said first circuit block has a first relative position with respect to said first circuit block, and said first relative position is equivalent to a second relative position of a part of said at least one conductive sub-line located over any other identical circuit block in said first group of identical circuit blocks.

3. The design method as set forth in claim 2, wherein said part of said first conductive line and said part of said at least one conductive sub-line are formed from at least one first virtual path of a lattice and at least one second virtual path of said lattice, and said at least one first virtual path is identical in a direction and a wiring level with said at least one second virtual path.

4. The design method as set forth in claim 1, wherein said at least one conductive sub-line is connected at one end thereof to said first conductive line.

5. The design method as set forth in claim 4, wherein a part of said first conductive line located over said first circuit block has a first relative position with respect to said first circuit block, and said first relative position is equivalent to a second relative position of a part of said at least one conductive sub-line located over said any other identical circuit block in said first group of identical circuit blocks.

6. The design method as set forth in claim 5, wherein said part of said first conductive line and said part of said at least one conductive sub-line are formed from at least one first virtual path of a lattice and at least one second virtual path of said lattice, and said at least one first virtual path is symmetrically identical in a direction and identical in a wiring level with said at least one second virtual path.

7. The design method as set forth in claim 1, wherein said at least one conductive sub-line is connected at both ends thereof to said one of said conductive lines.

8. The design method as set forth in claim 7, wherein a part of said first conductive line located over said first circuit block has a first relative position with respect to said first circuit block, and said first relative position is symmetrically equivalent to a second relative position of a part of said at least one conductive sub-line located over any other identical circuit block in said first group of identical circuit blocks.

9. The design method as set forth in claim 8, wherein said part of said first conductive line and said part of said at least one conductive sub-line are formed from at least one first virtual path of a lattice and at least one second virtual path of said lattice, and said at least one first virtual path is symmetrically identical in a direction and identical in a wiring level with said at least one second virtual path.

10. The design method as set forth in claim 7, wherein a signal directly passing through said first conductive line encounters a first resistance approximately equal to a second resistance against said signal passing through said at least one conductive sub-line.

11. The design method as set forth in claim 10, wherein the length of a signal propagation path without passing through said at least one conductive sub-line is approximately equal to the length of a signal propagation path passing through said at least one conductive sub-line.

12. The design method as set forth in claim 1, further comprising:
   forming at least one first conductive path inside a periphery of said first circuit block; and
   forming at least one second conductive path inside a periphery of another identical circuit block in said first group of identical circuit blocks, and said at least one first conductive path and said at least one second conductive path form a part of said first conductive line and a part of said at least one conductive sub-line.

13. The design method as set forth in claim 12, wherein said at least one first conductive path and said at least one second conductive path have a first relative position with respect to said first circuit block and a second relative position with respect to said another identical circuit block in said first group of identical circuit blocks, and said first relative position is equivalent to said second relative position.

14. The design method as set forth in claim 12, wherein said at least one conductive sub-line is connected at one end thereof to said one of said conductive lines.

15. The design method as set forth in claim 12, wherein said selectively routing of said conductive lines further comprises:
   sequentially selecting pairs of said nodes to be electrically interconnected;
   for each said pair of nodes, routing a temporary line between said pair of nodes;
   checking sections of said route data to determine whether or not said temporary line passes over any of said at least one group of identical circuit blocks;
   if said temporary line does not pass over any of said at least one group of identical circuit blocks, establishing said temporary line as a permanent interconnection between said pair of nodes; and
   if said temporary line passes over any of said at least one group of identical circuit blocks, determining a route for said at least one conductive sub-line and establishing said temporary line and said at least one sub-line as permanent.

16. The design method as set forth in claim 1, wherein said selectively routing of said conductive lines further comprises:
   sequentially selecting pairs of said nodes to be electrically interconnected;
   for each said pair of nodes routing a temporary line between said pair of nodes;
   checking sections of said route data to determine whether or not said temporary line passes over any of said at least one group of identical circuit blocks;
   if said temporary line does not pass over any of said at least one group of identical circuit blocks, establishing said temporary line as a permanent interconnection between said pair of nodes; and
   if said temporary line passes over any of said at least one group of identical circuit blocks, determining a route for said at least one conductive sub-line and establishing said temporary line and said at least one sub-line as permanent.

17. A semiconductor integrated circuit device fabricated on a semiconductor chip, comprising:
   a plurality of circuit blocks having at least one group of said circuit blocks that are identical in circuit characteristics with one another; and
   a plurality of conductive lines selectively interconnecting said plurality of circuit blocks, such that, if any of said plurality of conductive lines passes over any of said at least one group of identical circuit blocks, a conductive sub-line branches from said conductive line so as to pass over at least one other identical circuit block in said group.

18. The semiconductor integrated circuit device as set forth in claim 17, wherein said conductive sub-line is connected at one end thereof to said corresponding conductive line.

19. The semiconductor integrated circuit device as set forth in claim 17, wherein said conductive sub-line is connected at both ends thereof to said corresponding conductive line.

20. The semiconductor integrated circuit device as set forth in claim 17, wherein said conductive sub-line has a first part located over said one of said identical circuit blocks and said corresponding conductive line has a second part located over said another of said identical circuit blocks and said first part has a relative position with respect to said one of said identical circuit blocks equivalent to a relative position of said second part with respect to said another of said identical circuit blocks.

21. A method of routing interconnecting lines between terminals of circuit blocks to be integrated into a circuit, comprising:
   determining, from among all said circuit blocks, circuit blocks expected to share identical circuit characteristics;
   selectively arranging said identical circuit blocks into at least one group of identical circuit blocks, each said at least one group containing at least two identical circuit blocks; and
   selectively routing said interconnecting lines such that, if any of said lines passes over any of said at least one group of identical circuit blocks, then providing an extension from said line, said extension passing over at least one other identical circuit block in said any of at least one group.

22. The method of claim 21, wherein said selectively arranging said identical circuit blocks further comprises aligning linearly said at least two identical circuit blocks in each said at least one group of identical circuit blocks.

23. The method of claim 21, wherein said selectively arranging said identical circuit blocks further comprises arranging said at least two identical circuit blocks in each said group in a symmetrical manner.

24. The method of claim 23, wherein said symmetrical manner comprises a substantially mirror image.

25. The method of claim 21, wherein both ends of said extension connect to said interconnecting line.

26. The method of claim 21, wherein said selective routing of said extension and said corresponding interconnection line provides said at least two underlying identical circuit blocks with a substantially identical electrical effect due to any signal passing through said extension and said corresponding interconnection line.

27. The method of claim 26, wherein said substantially identical electrical results from selectively routing said interconnection line and said corresponding extension over said identical circuit blocks in a substantially identical or symmetrical routing.

* * * * *